US009072162B2

(12) United States Patent
Finley et al.

(10) Patent No.: US 9,072,162 B2
(45) Date of Patent: Jun. 30, 2015

(54) CONDUCTIVE PLASTIC OVERMOLD ON SHIELDED PLASTIC WINDOW

(75) Inventors: Matthew Finley, Haddonfield, NJ (US); John Perkins, Wilmington, MA (US); Peter Z. Torok, Brockport, NY (US); Robert H. Foster, Newburyport, MA (US); Robert Cowperthwait, Millville, NJ (US); John H. Beswick, Williamson, NY (US); David Inman, Acton, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 78 days.

(21) Appl. No.: 13/391,414

(22) PCT Filed: Nov. 19, 2010

(86) PCT No.: PCT/US2010/057363
§ 371 (c)(1),
(2), (4) Date: Apr. 26, 2012

(87) PCT Pub. No.: WO2011/063194
PCT Pub. Date: May 26, 2011

(65) Prior Publication Data
US 2012/0201011 A1 Aug. 9, 2012

Related U.S. Application Data

(60) Provisional application No. 61/262,574, filed on Nov. 19, 2009.

(51) Int. Cl.
*H05K 9/00* (2006.01)
(52) U.S. Cl.
CPC .................................. *H05K 9/0005* (2013.01)

(58) Field of Classification Search
CPC ..................................................... H05K 9/0005
USPC ........... 361/816, 818; 174/520, 521; 257/789, 257/795
See application file for complete search history.

(56) References Cited

U.S. PATENT DOCUMENTS

| 3,305,623 | A |   | 2/1967  | Bakker et al. |
|-----------|---|---|---------|---------------|
| 3,431,348 | A |   | 3/1969  | Nellis et al. |
| 3,469,015 | A |   | 9/1969  | Warren        |
| 3,583,930 | A | * | 6/1971  | Ehrreich ........................ 252/514 |
| 4,247,737 | A |   | 1/1981  | Johnson et al. |
| 4,412,255 | A |   | 10/1983 | Kuhlmann et al. |
| 4,514,585 | A |   | 4/1985  | Paynton       |
| 4,631,214 | A |   | 12/1986 | Hasegawa      |
| 4,643,785 | A |   | 2/1987  | Paynton       |
| 4,701,801 | A | * | 10/1987 | Hobbins et al. ................ 348/819 |

(Continued)

OTHER PUBLICATIONS

PCT/US2010/057363 International Search Report dated Jan. 24, 2011.

*Primary Examiner* — Jenny L Wagner
*Assistant Examiner* — Michael P McFadden
(74) *Attorney, Agent, or Firm* — Renner, Otto, Boisselle & Sklar, LLP

(57) ABSTRACT

An integrated assembly is provided for installation on a housing for electronic components. The integrated assembly includes a shielded window and a bezel overmolded onto the shielded window in an injection molding process. Since both the shielded window and the bezel have EMI resistant properties, the assembly represents an efficient method for providing high quality EMI shielding while eliminating the use of costly parts and assembly procedures.

6 Claims, 3 Drawing Sheets

(56) References Cited

U.S. PATENT DOCUMENTS

| | | | |
|---|---|---|---|
| 4,755,659 A * | 7/1988 | Leon et al. | 219/547 |
| 4,910,090 A | 3/1990 | Kuhlmann et al. | |
| 4,941,207 A | 7/1990 | Maeda et al. | |
| 5,032,689 A | 7/1991 | Halligan et al. | |
| 5,371,404 A * | 12/1994 | Juskey et al. | 257/659 |
| 5,486,847 A | 1/1996 | Ranf et al. | |
| 6,188,015 B1 | 2/2001 | Curran, Sr. et al. | |
| 6,454,449 B2 * | 9/2002 | Nestell et al. | 362/520 |
| 6,552,263 B2 * | 4/2003 | Farquhar et al. | 174/521 |
| 6,686,536 B2 | 2/2004 | Tone et al. | |
| 6,828,534 B2 | 12/2004 | Leutner et al. | |
| 7,351,479 B2 * | 4/2008 | Funkenbusch et al. | 428/626 |
| 7,616,448 B2 * | 11/2009 | Degenkolb et al. | 361/752 |
| 2006/0027383 A1 | 2/2006 | Kim et al. | |
| 2006/0035073 A1 | 2/2006 | Funkenbusch et al. | |
| 2008/0047747 A1 | 2/2008 | Aoyama et al. | |
| 2008/0078733 A1 * | 4/2008 | Nearman et al. | 211/189 |
| 2008/0151503 A1 * | 6/2008 | Aapro et al. | 361/714 |
| 2009/0025650 A1 * | 1/2009 | Schrick | 119/712 |
| 2009/0117951 A1 * | 5/2009 | Alameh et al. | 455/575.1 |

* cited by examiner

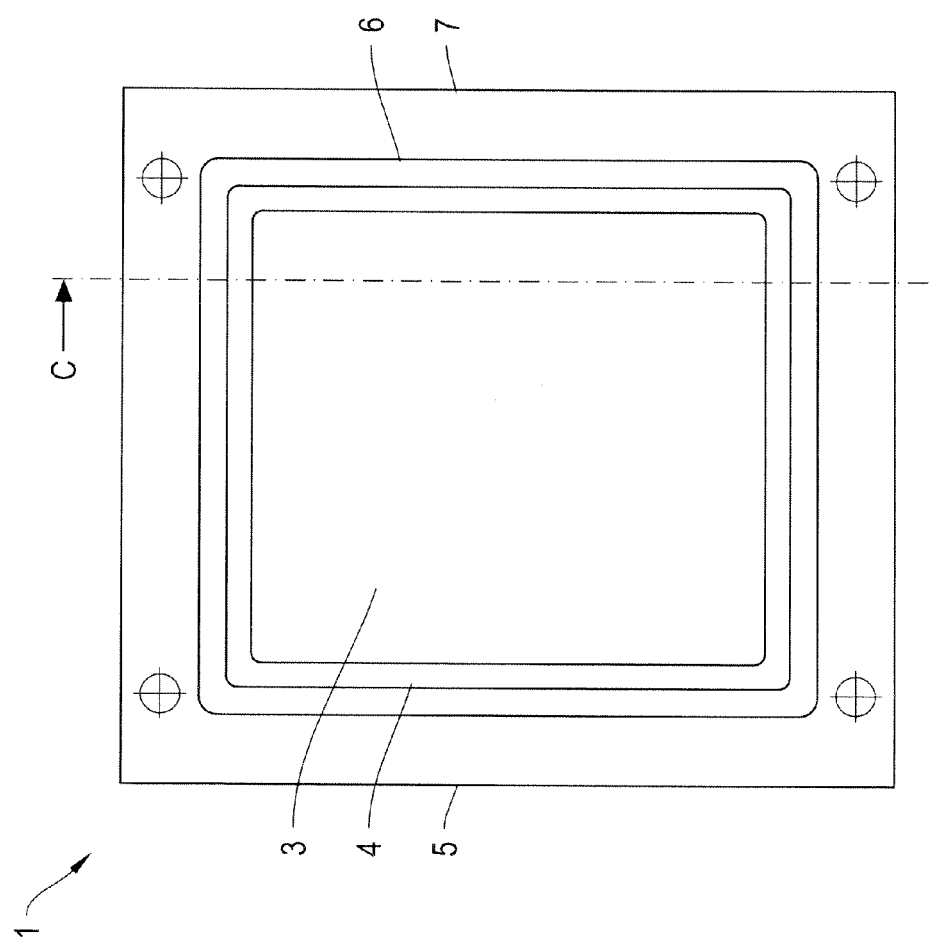

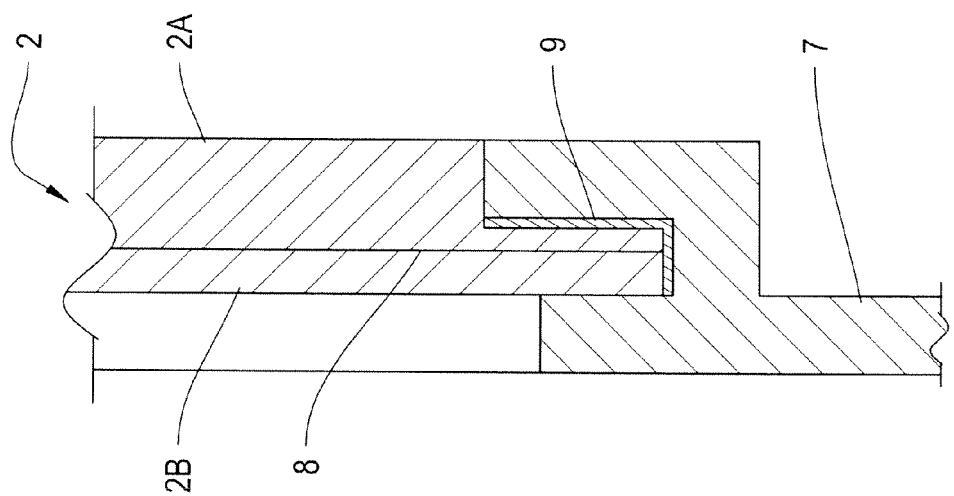

CONDUCTIVE PLASTIC OVERMOLD ON SHIELDED PLASTIC WINDOW

CROSS-REFERENCE TO RELATED APPLICATIONS

This application claims the benefit of priority of U.S. Provisional Application No. 61/262,574, filed on Nov. 19, 2009, the disclosure of which is incorporated herein by reference thereto in its entirety.

BACKGROUND OF THE INVENTION

The present invention relates to an assembly for mounting onto an electronic enclosure comprising a conductive plastic bezel and a shielded window. The plastic bezel is overmolded onto the periphery of the shielded window in an injection molding process, thereby providing an integrated construction with improved electrical contact between the bezel and the shielded window. As a result, the shielding integrity of the integrated assembly is maintained without the need for additional shielding materials which would be required if separate parts were used. The bezel permits an environmental seal and electrical contact to be maintained between the bezel and the shielded window for improved EMI shielding.

As is known in the art, EMI energy is energy that is radiated or conducted from a source, and adversely affects the performance of an electronic circuit impacted by the radiation. EMI and/or RFI may be eliminated or reduced by the use of shielded enclosures and the use of appropriate shielding materials.

The operation of electronic equipment, such as televisions, radios, computers, medical instruments, business machines, communication equipment, and the like, is typically accompanied by the generation of radio frequency and/or electromagnetic radiation within the electronic circuits of the electronic system. The increasing operating frequency in commercial electronic enclosures, such as computers and automotive electronic modules, results in an elevated level of high frequency electromagnetic interference (EMI). The decrease in size of handheld electronic devices, such as cellular phone handsets, has exacerbated the problem. If not properly shielded, such radiation can cause considerable interference with unrelated equipment. Accordingly, it is necessary to effectively shield and ground all sources of radio frequency and electromagnetic radiation within the electronic system.

Typical EMI protective devices include conductive coatings, EMI shielding gaskets, conductive films, and metalized fabrics, screens and meshes. These devices are deployed to block the transmission of unwanted EMI energy into and out of electronic equipment. Windows containing fine wire mesh and conductive transparent films have been typically used to shield display panels, including displays for electronic devices. Such devices are described in U.S. Pat. Nos. 4,910,090 and 5,489,489, as well as EP 810452, the respective disclosures of which are incorporated by reference herein in their entirety.

Transparent EMI shielding films employing polymers, such as PET, and conductive particles, such as ITO (indium tin oxide), silver and conductive oxides, are available commercially from various suppliers. An example of this type of commercial film is the AgF8 film sold by the Parker Hannifin Corporation (Chomerics Division). AgF8 is a multi-layer conductive, silver-oxide based polyester film which has optical transparency and high electrical conductivity. These films, typically on the order of 175 microns in thickness, are used to shield electronic equipment from EMI and RFI radiation. Electronic equipment which can be shielded in this manner includes, by way of example, electronic displays, membrane switch panels, access panels and windows used for the display of electronic data, i.e. shielded windows.

The shielded window as described above is generally affixed to an electronic device using an interface part, typically a bezel. The bezel is similar to a picture frame and is mounted on the outer periphery of the window. Once mounted on the shielded window, the bezel can be used to affix the window to the electronic device. The primary purpose of the bezel is to secure the shielded window to the device using a physical attachment part, such as a screw or bolt. A gasket having EMI shielding properties can be used to provide an environmentally secure seal between the bezel and the shielded window. The gasket thereby serves to prevent radiation leakage at the sealing juncture. Alternatively, a secure seal can be provided through the use of conductive busbars, foil tapes, extended mesh components of the shielded window, and conductive adhesives, all of which serve to provide electrical conductivity and shielding capabilities.

The type of construction necessary to assemble a bezel and window involves the assembly of two or more separate parts, which is costly and labor intensive. This type of assembly is also prone EMI leakage problems, and is costly to repair and replace.

Accordingly, it is an objective of the present invention to provide an improved shielded window assembly that is simple to manufacture, has superior performance characteristics, and is easier to mount to an electronic device as compared to existing assemblies.

SUMMARY OF THE INVENTION

The present invention provides an EMI shielded window assembly comprising an EMI-shielded window and a plastic bezel molded over the outer perimeter of the window in an injection molding operation. Preferably, the bezel is formed from an electrically conductive thermoplastic material. The result is an integral construction of an intrinsically conductive and corrosion resistant part which can be mounted on the frame of an electronic device or display panel. Methods for preparing the EMI shielded window assembly are also described.

In one embodiment, the shielded window is a laminated article having a first layer formed from a transparent plastic material and a second layer formed from an electrically conductive sheet or mesh.

In one aspect, the electrically conductive mesh is a layer of a metal or metal alloy, such as copper or stainless steel. Preferably, the mesh is blackened.

In another embodiment, the electrically conductive film applied to the window surface is a layer of a polymeric film, such as a polyester film, having a metallic coating applied to the surface of the film, such as by sputtering. Preferably, the coating is an indium oxide coating.

In a further embodiment, the bezel is formed from a thermoplastic material incorporating an electrically conductive particulate filler.

In a still further embodiment, the outer perimeter of the window has a thickness less that the thickness of the inner section of the window.

BRIEF DESCRIPTION OF THE DRAWINGS

The foregoing and other advantages and features of the invention will become apparent upon reading the following detailed description and upon reference to the drawings in which:

FIGS. 1A and 1B are plan and cross-sectional views, respectively, showing the shielded window and bezel assembly of the present invention.

FIG. 1C is an exploded view of the end portion of the window and bezel assembly of FIG. 1B taken along section D-D.

DESCRIPTION OF THE PREFERRED EMBODIMENTS

Figure 2:
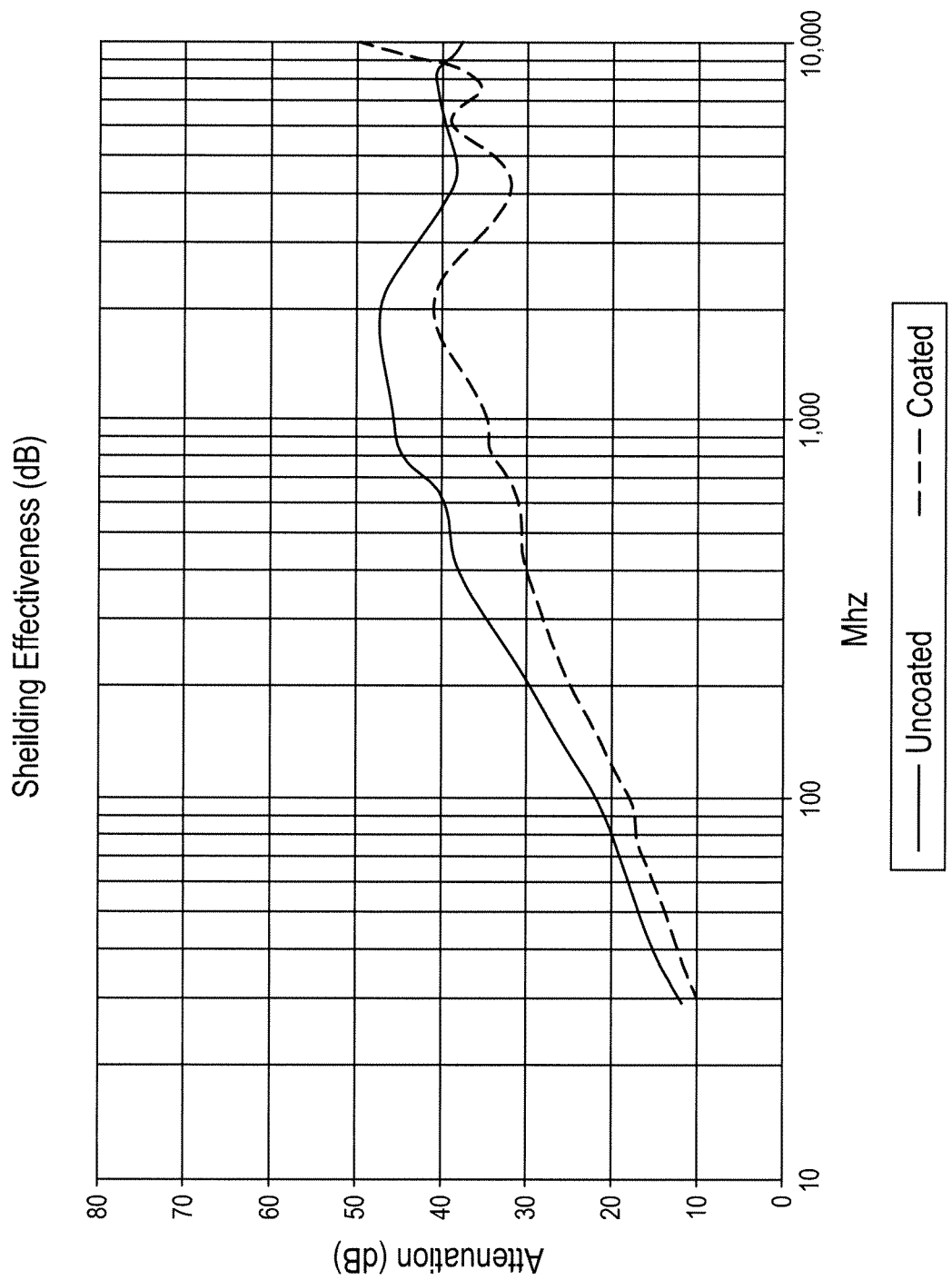
FIG. 2 is a plot of attenuation against frequency for a representative shielded window/bezel assembly of the invention having a coated and uncoated busbar, compared to a standard assembly.

The present invention is directed to an integral assembly comprising a shielded window and a bezel. The assembly is adapted for mounting onto electronic displays and panels where EMI shielding properties are required in both military and civilian applications.

As used herein, the term "a" refers to "at least one", unless otherwise mentioned.

The terms "approximately the same" or "approximately equal" refer to nearly the same size with respect to the tolerance for interface, the free relative movement of parts, and the like.

By "overmolding" is generally meant an injection molding process whereby one part is molded on top of another part. A previously molded first part is inserted in a mold cavity, and the second part is molded over the first in an injection molding process to effectively create the final integrated assembly.

The term "window", as used herein, is intended to denote a display panel for an electronic or telecommunications device. Representative devices include instruments, displays (e.g. plasma displays), imaging equipment (e.g. magnetic resonance imaging equipment), computer equipment, monitors, telecommunications equipment (e.g. cellular phones), medical devices, and the like. The window substrate can be formed from a variety of materials including, but not limited to, glass or other glazing material (tempered, insulated, laminated, annealed or heat strengthened), and plastics (e.g. polycarbonates, polymethylmethacrylate, and the like). Also, as described herein, the window is shielded against EMI radiation.

The assembly of the present invention comprises a shielded window and a bezel. The bezel is used for mounting the window to an electronic panel and sealing the enclosure against EMI radiation.

The window component of the assembly is preferably formed from glass or plastic, preferably a clear or transparent thermoplastic or thermosetting polymer having at least 50 percent transmission from IR to UV wavelengths, or at selected wavelengths. Suitable polymers include polyester, polycarbonate or acrylic polymers, or some combination of glass and plastic materials.

The window can be shielded using a variety of techniques. One method of shielding involves coating a face of the window with a polymeric coating containing a conductive filler or conductive particles. The coating provides a film layer of a polymer which may contain electrically conductive particles. The electrically conductive particles are selected based on electrical conductivity and optical properties, i.e. transparency. Silver oxide and indium tin oxide are preferred conductive particles. The window is preferably coated on the side facing the electronic enclosure to form a conductive film. Alternatively, the conductive film is sandwiched between adjacent plastic or glass substrates. The window may also include contrast enhancement features or polarizers.

In another embodiment, the coating layer can comprise a layer of a polymeric film, such as a polyester film, having a metallic coating applied to the surface of the polymer by, for instance, sputter coating or electroless or electrolytic plating. The plated layer adheres to the coating and provides shielding protection to the window. The plated metal can be, for instance, copper, silver or nickel, with indium tin oxide being preferred. The plated layer can be "blackened" after it has been applied to the coating using a sulfide bath. "Blackening" prevents unwanted light reflection and enhances the overall optical and visual effects of the window.

Alternatively, shielding characteristics can be imparted to the window using a knitted or woven wire mesh laminated between adjacent glass or plastic substrates. The wire mesh can be formed from metals such as copper or stainless steel, which can be blackened if desired. The mesh openings typically range form about 0.030 mm to about 0.06 mm. Shielding effectiveness of the mesh is determined, at least in part, by the size of the wire screen openings, the electrical contact between intersecting wires, fabrication materials, and techniques employed to terminate the wire at the edge of the window. Such techniques include the use of conductive busbars, foil tape, extended mesh segments, conductive adhesives, and conductive gaskets.

Commercially available shielded windows of the type within the scope of the present invention include the WINSHIELD™ optical products and the CHO-ITO™ coated conductive windows sold by the Parker Hannifin Corporation (Chomerics Division).

The shielded window requires a bezel or other housing for attachment to an electronics panel or display device. The bezel is designed to fit around or frame the window, and to secure the window to the panel. The bezel is also required to provide an environmentally secure seal between the window and the panel. By "environmentally secure seal" is meant, in the context of the invention, a seal that primarily protects against environmental radiation leakage, and also provides some measure of corrosion resistance.

The bezel is a plastic element, preferably formed from a conductive thermoplastic, although a plastic coated with an electrically conductive coating may also be operable in the invention if the bezel is rendered conductive thereby. Suitable polymers for use in fabricating the bezel include, by way of example, those thermoplastic polymers suitable for injection molding, including polycarbonate, polycarbonate/ABS, polybutylene terephalate (PBT), and the like. These thermoplastics may be made conductive using conducting particles or fibers, such as, for example, nickel/carbon fiber, nickel graphite powder, stainless steel fiber, and the like.

According to the method of the present invention, the bezel is overmolded onto the window by an injection molding process. In this process, the pre-formed window is deployed as an insert in the mold cavity, and the plastic bezel is injection molded on top of the window to at least partially encapsulate the window, forming an integrated construction unit or assembly. Preferably, the plastic used to form the bezel is an electrically conductive thermoplastic as described herein.

It is important to establish electrical contact between the shielded window and the bezel so as to prevent radiation leakage from the assembly. In a preferred embodiment, the window is shielded through the use of a wire mesh, and a conductive bus bar is deployed at the edge portion of the window. The busbar is a strip of metal, such as copper or stainless steel, which contacts the exposed portion of the wire mesh. The busbar also contacts the bezel, thereby creating an electrical pathway between the window and the bezel. The busbar can be coated with an electrically conductive coating for enhanced EMI shielding. Radiation leakage between the window/bezel assembly and the panel enclosure can be prevented through the use of conductive gasket materials inserted between the assembly and the panel.

Referring now to the figures, FIGS. 1A, 1B and 1C are plan, cross-sectional and exploded end views, respectively, of shielded window and bezel assembly 1. As shown, shielded window 2 has a transparent face 3, comprising the inner section of the window, and an outer perimeter 4 which has a thickness less than the inner section 3. Window 2 can be fabricated from polycarbonate as a uniform thin sheet. Alternatively, window 2 can be a laminated structure having a wire mesh 8 sandwiched between adjacent sheets 2A and 2B. In this alternative embodiment, an L-shaped busbar 9 is depicted in electrical contact with bezel 7 and wire mesh 8. The outer perimeter 4 can be formed by machining the polycarbonate material to a stepped down dimension. Bezel 5 has an inner section 6 and an outer section 7. Bezel 5 is preferably fabricated from a conductive thermoplastic containing conductive particles. Bezel inner section 6 overlaps and partly encapsulates outer perimeter 4 of the window. Assembly 1 is formed by overmolding bezel 5 onto the preformed window 2 as described herein.

EXAMPLE

A sample of a shielded window and bezel assembly is evaluated for shielding effectiveness. The shielded window is a Win-Shield P 80 OPI G2 45 degree encapsulated stainless steel mesh with an exposed "L" busbar. The window has an anti-glare hard coat on one side. The busbar provides electrical contact between the shielded window stainless steel mesh and the electrically conductive plastic bezel overmolded on the window. Two sample configurations are evaluated: one configuration has a plain busbar, and the other configuration has a busbar coated with an electrically conductive coating.

The samples are evaluated for shielding effectiveness and compared to samples of an "open" configuration wherein the bezel and window are assembled without overmolding. The results (dB) are recorded in Table 1 below for the indicated frequencies, field type and antenna settings.

FIG. 2 is a graph showing the relative effectiveness of the assembly of the invention in comparison to the control (open) configuration.

TABLE 1

| Type of Field | Frequency | Antenna Polarization | Open Configuration (dB) | Closed Configuration (dB) | Shielding Effectiveness (dB) Uncoated Busbar | Closed Configuration (dB) | Shielding Effectiveness (dB) Coated Busbar |
|---|---|---|---|---|---|---|---|
| E | 30 | H | −72 | −82 | 10 | −84 | 12 |
| E | 40 | H | −71 | −83 | 12 | −86 | 15 |
| E | 60 | H | −50 | −65 | 15 | −68 | 18 |
| E | 80 | H | −43 | −60 | 17 | −63 | 20 |
| E | 100 | H | −46 | −64 | 18 | −68 | 22 |
| E | 200 | H | −26 | −51 | 25 | −56 | 30 |
| E | 400 | C | −16 | −46 | 30 | −54 | 38 |
| E | 600 | C | −13 | −44 | 31 | −53 | 40 |
| E | 800 | C | −14 | −48 | 34 | −59 | 45 |
| E | 1,000 | C | −6 | −41 | 35 | −52 | 46 |
| E | 2,000 | V | −34 | −75 | 41 | −81 | 47 |
| E | 4,000 | V | −12 | −44 | 32 | −51 | 39 |
| E | 6,000 | V | −4 | −43 | 39 | −44 | 40 |
| E | 8,000 | V | −12 | −48 | 36 | −53 | 41 |
| E | 10,000 | V | −4 | −54 | 50 | −42 | 38 |

Various other embodiments are possible and within the spirit and scope of the invention and the appended claims. The aforementioned embodiments are for explanatory purposes only, and are not intended to limit the invention in any manner. The invention intends to cover all the equivalent embodiments and is limited only by the appended claims. The pertinent disclosures of all patents listed herein are incorporated by reference in their entireties.

What is claimed is:

1. An integral EMI shielded window assembly comprising: an EMI-shielded window having an outer perimeter, said window comprising an electrically-conductive wire mesh laminated between adjacent glass or plastic sheets; an overmolded electrically-conductive plastic bezel providing an environmentally secure seal around the outer perimeter of the window and forming a single integral unitary structure with the window; and a busbar contacting the wire mesh and bezel providing electrical conductivity between the wire mesh and bezel, said busbar being coated with an electrically conductive coating.

2. The assembly of claim 1 wherein the electrically conductive wire mesh comprises stainless steel.

3. The assembly of claim 1 wherein the mesh is blackened.

4. The assembly of claim 1 wherein the electrically-conductive plastic comprises an electrically-conductive particulate filler.

5. The assembly of claim 1 wherein the window comprises an inner section and an outer perimeter surrounding the inner section, the inner section having a first thickness and the outer perimeter having a second thickness less than the first thickness, the bezel being molded over at least a portion of the outer perimeter.

6. An electronic device having improved EMI shielding comprising:
  an enclosure for electronic components; and
  the assembly of claim 1;
wherein said assembly is affixed to the front panel of the enclosure.

* * * * *